(12) United States Patent
Du et al.

(10) Patent No.: US 7,432,711 B2
(45) Date of Patent: Oct. 7, 2008

(54) RADIAL COIL ARRANGEMENT FOR A MAGNETIC RESONANCE APPARATUS

(75) Inventors: Jian-Jun Du, Shenzhen (CN); Arne Reykowski, Gainesville, FL (US); Markus Vester, Nürnberg (DE); Jian Min Wang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 29 days.

(21) Appl. No.: 11/540,622

(22) Filed: Sep. 29, 2006

(65) Prior Publication Data

US 2007/0085634 A1 Apr. 19, 2007

(30) Foreign Application Priority Data

Sep. 30, 2005 (CN) .................. 2005 1 0108825

(51) Int. Cl.
*G01V 3/00* (2006.01)
*H01P 7/00* (2006.01)

(52) U.S. Cl. .................. 324/318; 324/322; 324/303; 324/307

(58) Field of Classification Search ......... 324/318–322, 324/307, 300–303, 309; 333/219, 219.1, 333/219.2; 600/410, 411, 422, 425
See application file for complete search history.

(56) References Cited

U.S. PATENT DOCUMENTS

| | | | | | |
|---|---|---|---|---|---|
| 3,172,035 | A | * | 3/1965 | Arnold et al. | 324/321 |
| 3,402,346 | A | * | 9/1968 | Baker | 324/322 |
| 3,488,561 | A | * | 1/1970 | Anderson | 361/146 |
| 5,075,624 | A | * | 12/1991 | Bezjak | 324/318 |
| 5,153,517 | A | | 10/1992 | Oppelt et al. | 324/322 |
| 5,361,765 | A | * | 11/1994 | Herlihy et al. | 600/422 |
| 6,177,797 | B1 | * | 1/2001 | Srinivasan | 324/318 |
| 7,084,629 | B2 | * | 8/2006 | Monski et al. | 324/318 |
| 2005/0099179 | A1 | * | 5/2005 | Monski et al. | 324/318 |
| 2007/0085634 | A1 | * | 4/2007 | Du et al. | 333/219.2 |

* cited by examiner

*Primary Examiner*—Brij Shrivastav
*Assistant Examiner*—Tiffany A Fetzner
(74) *Attorney, Agent, or Firm*—Schiff Hardin LLP

(57) ABSTRACT

A coil arrangement for a magnetic resonance apparatus has a number of coil elements that are capable of being operated independently of one another and are situated around a common central area. Each coil element of the coil arrangement is capacitively or inductively decoupled from the coil elements of the coil arrangement that are immediately adjacent to this coil element. In the central area, there is situated a capacitor network that connects the coil elements of the coil arrangement to one another. The capacitor network is fashioned and dimensioned such that it at least reduces the coupling of each coil element of the coil arrangement to at least one additional coil element of the coil arrangement that is not immediately adjacent to the respective coil element.

8 Claims, 9 Drawing Sheets

RADIAL COIL ARRANGEMENT FOR A MAGNETIC RESONANCE APPARATUS

BACKGROUND OF THE INVENTION

1. Field of the Invention

The present invention relates to a coil arrangement for a magnetic resonance apparatus, of the type having a number of coil elements situated around a common central area, with each coil element of the coil arrangement being decoupled from the immediately adjacent coil elements of the coil arrangement.

2. Description of the Prior Art

A coil arrangement of this general type is known, from example, from U.S. Pat. No. 5,153,517.

In the coil arrangement known from U.S. Pat. No. 5,153,517, four coil elements are present. Each two coil elements situated diametrally opposite one another are coupled to one another. The coupling is such that the magnetic field produced by each pair of coil elements situated diametrally opposite one another proceeds perpendicular to the magnetic field produced by the other pair of coil elements situated diametrally opposite one another. The two pairs of coil elements situated diametrally opposite one another are therefore decoupled from one another.

In U.S. Pat. No. 5,153,517, the coil elements are able to be operated only in pairs, i.e., not independently of one another. Only in this way does the decoupling of immediately adjacent coil elements result.

SUMMARY OF THE INVENTION

An object of the present invention is to provide a coil arrangement for a magnetic resonance apparatus in which the coil elements are able to be operated independently of one another.

In a coil arrangement of the type cited above, the object is achieved by each coil element of the coil arrangement being capacitively or inductively decoupled from the coil elements of the coil arrangement that are immediately adjacent to that coil element and in the central area, there is situated a capacitor network that connects the coil elements of the coil arrangement to one another, and the capacitor network is fashioned and dimensioned such that it at least reduces the coupling of each coil element of the coil arrangement to at least one additional coil element of the coil arrangement that is not immediately adjacent to the respective coil element.

The capacitor network can be fashioned and dimensioned such that each coil element of the coil arrangement is decoupled from at least one additional, not immediately adjacent coil element, so an even better independent operation of the individual coil elements is possible. This is most effectively achieved if the capacitor network is fashioned and dimensioned in such a way that each coil element of the coil arrangement is decoupled from all coil elements of the transmitting system that are not immediately adjacent to it.

It is possible for each coil element of the transmitting system to be composed up of individual conductor areas that are allocated exclusively to respective coil elements. Preferably, however, immediately adjacent coil elements of the coil arrangement each have a common conductor area that proceeds essentially radially relative to the central area.

A simple design of the capacitor network is achieved in an embodiment wherein the capacitor network has a ring having ring segments, the common conductor areas of each coil element of the coil arrangement being connected to one another via respective ring segments, and one of the capacitors of the capacitor network being situated in each ring segment.

The capacitor network may contain no additional capacitors beyond the capacitors situated in the ring segments. In this case, suitable decoupling elements must be situated in the coil elements themselves. In the case of capacitive decoupling, for example, decoupling capacitors are preferably situated in the common conductor areas. It is also possible for the capacitor network to contain additional capacitors. In this case, in particular the decoupling capacitors can be components of the capacitor network.

The number of coil elements of the coil arrangement can be even or odd. The number is preferably even. In particular, it can be four.

If the number of coil elements of the coil arrangement is even, and the decoupling capacitors are components of the capacitor network, the number of required decoupling capacitors can be minimized in an embodiment wherein each decoupling capacitor decouples two pairs of respectively immediately adjacent coil elements of the coil arrangement.

DESCRIPTION OF THE DRAWINGS

FIGS. 1 to 4 show various embodiments of the same basic schematic design of a coil arrangement in accordance with the invention. Identical elements are therefore provided with identical reference characters in FIGS. 1 to 4, and also in FIGS. 5 to 9.

As shown in FIGS. 1 to 4, the coil arrangement for a magnetic resonance apparatus has a number of coil elements 1. The coil elements 1 are situated around a common central area 2 and are connected to one another via a central area 2. In FIG. 1, the number of coil elements 1 is four, in FIG. 2 it is five, in FIG. 3 it is six, and in FIG. 4 it is seven. Other numbers of coil elements 1 are also possible; for example 8, 9, 10, ... coil elements 1.

Figure 1:
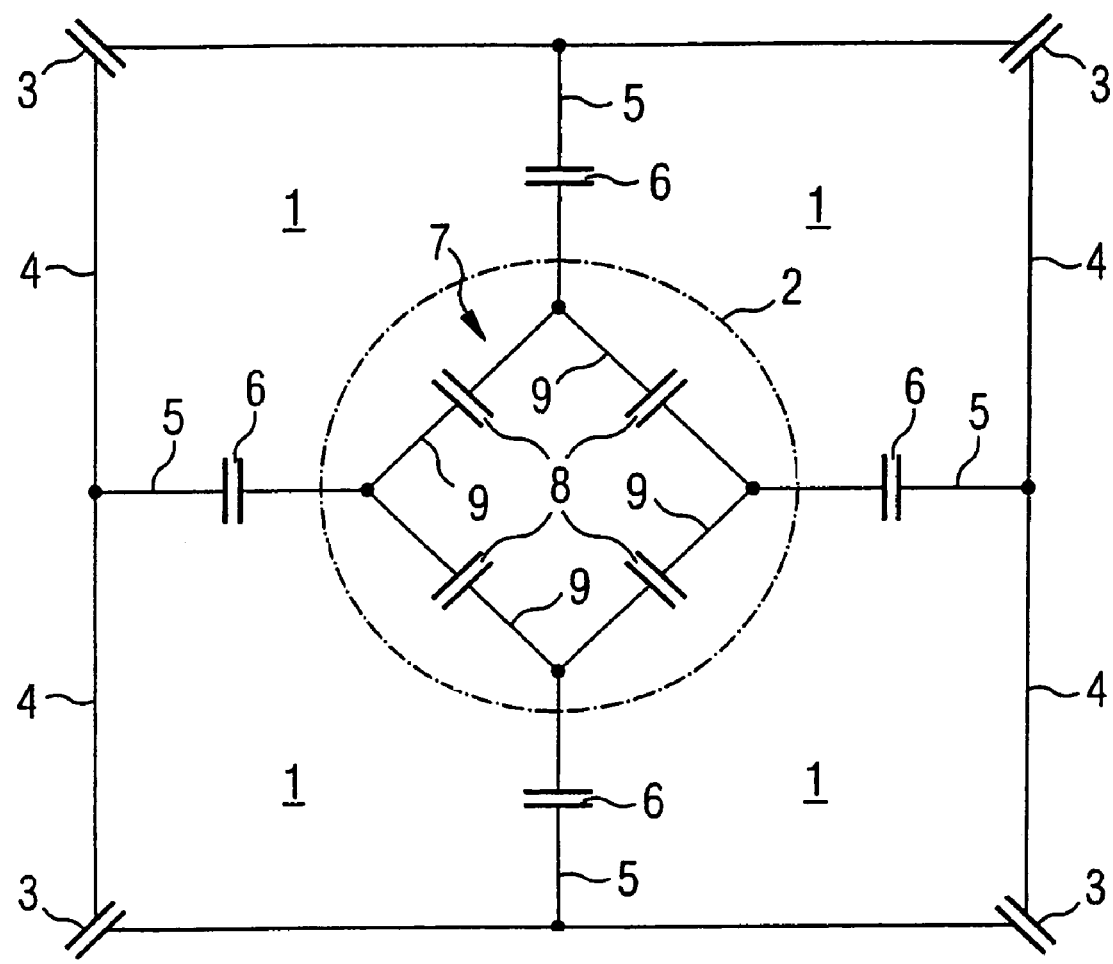
FIGS. 1 to 9 respectively show various coil arrangements in accordance with the invention.

Each coil element 1 has a separate feeder capacitor 3 that is allocated exclusively to the respective coil element 1. The feeder capacitors 3 are respectively situated in conductor segments 4 that are allocated exclusively to the respective coil elements 1. Therefore, in each coil element 1 a radio-frequency current can be fed in or coupled in via the respective feeder capacitor 3. In this case, the respective coil element 1 is operated in transmit mode, so that it radiates a radio-frequency magnetic field to its surrounding environment. Alternatively, it is also possible, via the feeder capacitor 3 that is allocated exclusively to the respective coil element 1, to couple out from the respective coil element 1 a radio-frequency current that is caused in the respective coil element 1 by a radio-frequency magnetic field. In this case, the respective coil element 1 is operated in reception mode. Due to the fact that a separate feeder capacitor 3 is allocated to each coil element 1, coil elements 1 are therefore capable of being operated independently of one another.

As can be seen, the coil elements 1 are situated around the central area 2 in azimuthal fashion. The term "azimuthal" here designates, as it conventionally does, an orientation around a point or around an axis; in the present case, around the central area 2. As a result of this situation of coil elements 1, each coil element 1 is immediately bordered by or is immediately adjacent to two coil elements 1 of the coil arrangement. In addition, for each coil element 1 there exists at least one additional coil element 1 that does not immediately border it or is not immediately adjacent thereto. In FIG. 1, there exists only one such additional coil element 1, while in FIGS. 2 to 4 there are multiple of coil elements 1 that do not immediately border a particular coil element 1.

As can also be seen from FIGS. 1 to 4, immediately adjacent coil elements 1 of the coil arrangement each have a common conductor area 5 that proceeds essentially radially relative to central area 2. The term "radially" here designates, as it generally does, an orientation away from a particular point or from a particular axis, or toward a particular point or toward a particular axis. In the present case, the term "radially" refers to an orientation that is directed towards central area 2 or that points away from this area.

In order for coil elements to not mutually influence one another during their mutually independent operation, in particular the immediately adjoining coil elements 1 should be decoupled from one another. According to FIGS. 1 to 4, this decoupling is achieved by the coupling capacitors 6 being situated in common conductor areas 5. In this case, a capacitive decoupling takes place.

Alternatively, coil elements 1 could overlap one another in overlap areas 6', so that an inductive coupling that would otherwise exist between immediately bordering coil elements 1 is compensated. This is shown schematically in FIG. 5 for a coil arrangement having four coil elements 1, but the arrangement in FIG. 5 can have a different number of coil elements 1. Furthermore, alternatively to an inductive decoupling via correspondingly dimensioned overlap areas 6', an inductive decoupling could be achieved using transformer coils.

According to FIGS. 1 to 5, in the central area 2 there is situated a capacitor network 7 having (of course) capacitors 8. This network connects coil elements 1 of the coil arrangement to one another.

According to FIGS. 1 to 5, the capacitor network 7 has a ring having ring segments 9. The common conductor areas 5 of the coil elements 1 of the coil arrangement are connected to one another via respective ring segments 9. In each ring segment 9 there is situated one of the capacitors 8 of capacitor network 7. According to FIGS. 1 to 5, the capacitor network 7 has no additional capacitors beyond the capacitors 8 situated in ring segments 9.

The capacitors 8 of the capacitor network 7 (and, as a result, the capacitor network 7) itself are matched to one another in such a way that for each coil element 1 of the coil arrangement they at least reduce the coupling of the respective coil element 1 to at least one additional coil element 1 of the coil arrangement that is not immediately adjacent to the respective coil element 1. The capacitor network 7 is therefore also fashioned and dimensioned to achieve this coupling reduction.

In general, the additional coil element 1 that itself is not immediately adjacent to the coil element 1 adjoins at least one of the two coil elements 1 that are immediately adjacent to the respective coil element 1. This is because the inductive coupling that is to be compensated is greatest in these coil elements 1.

In the ideal case, capacitor network 7 is fashioned and dimensioned in such a way that each coil element 1 of the coil arrangement is decoupled from the at least one additional coil element 1 that is not immediately adjacent to the respective coil element 1. Due to the fact that in FIG. 1 only a total of four coil elements 1 are present, the capacitor network 7 is thus fashioned and dimensioned such that each coil element 1 of the coil arrangement is decoupled from all other coil elements 1 of the coil arrangement that do not immediately adjoin the respective coil element 1. With a symmetrical design of the coil arrangement, this can also be achieved in the embodiment according to FIG. 2, i.e., with five coil elements 1.

Figure 3:
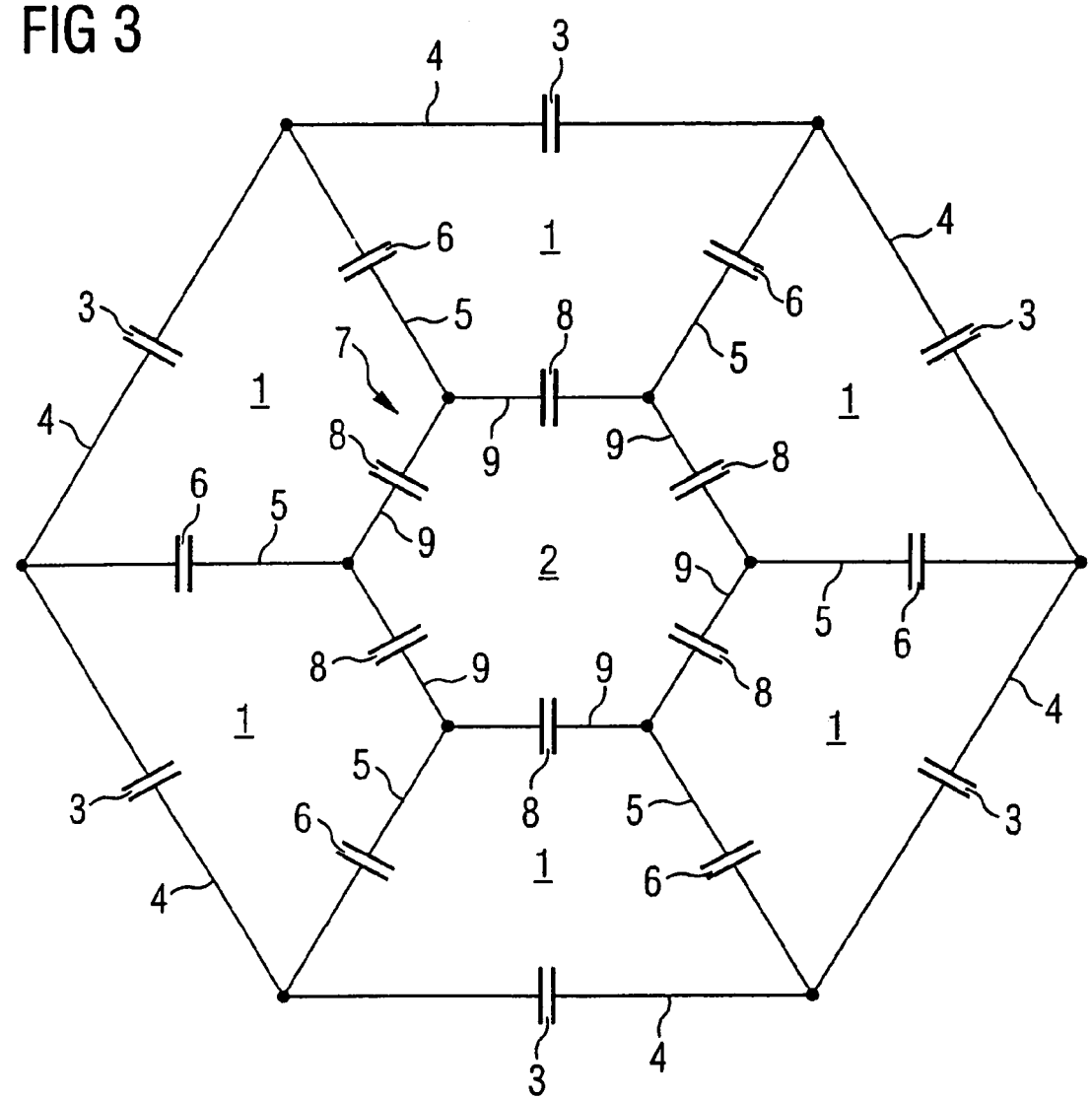
Figure 4:
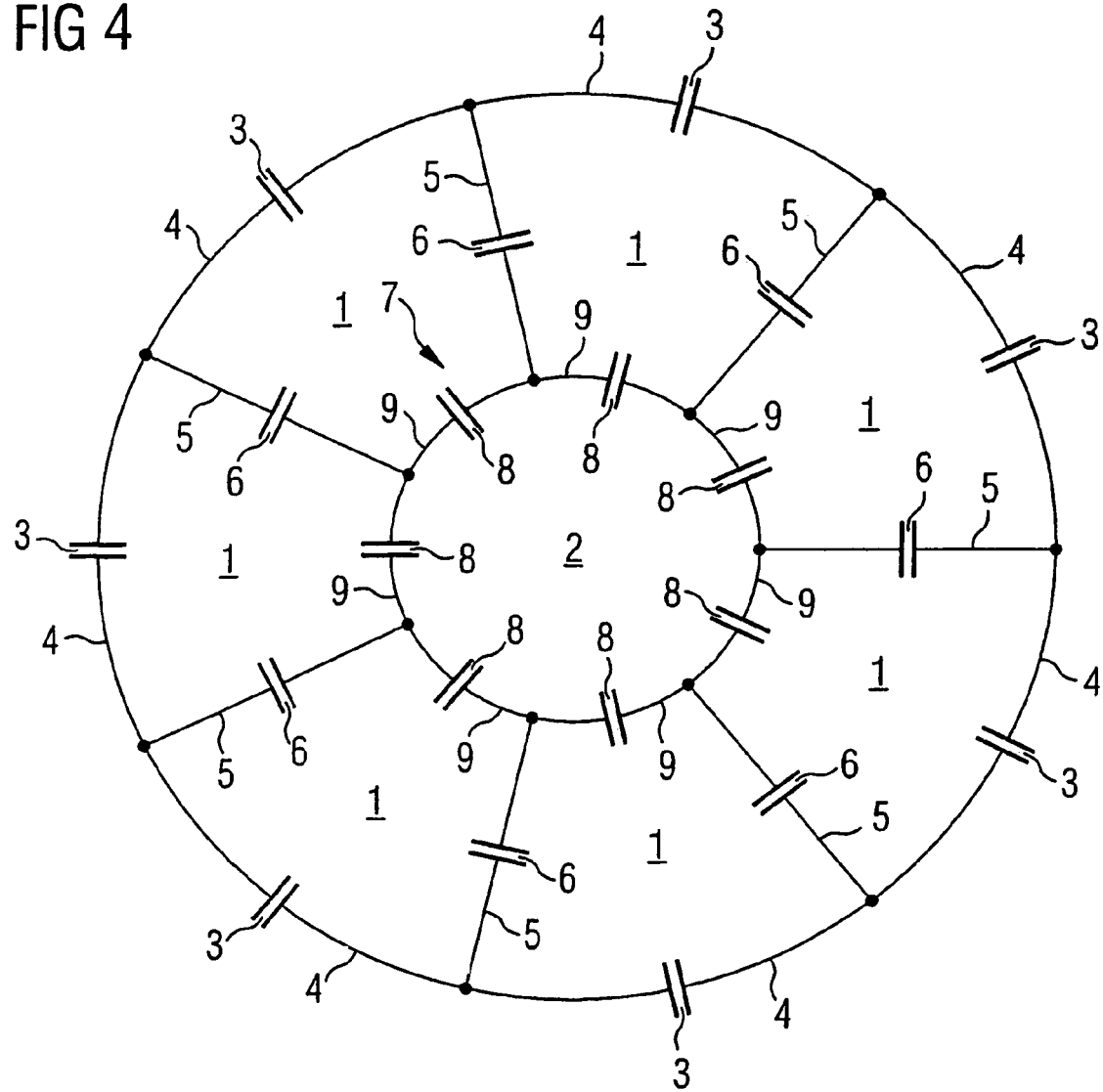

In contrast, in the construction shown in FIGS. 3 and 4, the design of the capacitor network 7 as merely a ring having ring segments 9 means that not every coupling between coil elements 1 can be compensated. A coupling of a particular coil element 1 to the coil element 1 situated diametrally opposite (FIG. 3), or to the coil elements 1 whose common conductor segment 5 is situated diametrally opposite the respective coil element 1 (FIG. 4), can no longer be compensated using the design of the capacitor network 7 according to FIGS. 3 and 4. However, this coupling is very slight, and can generally be tolerated in practice. Even this slight coupling could be compensated if the capacitor network 7 were to have additional capacitors beyond the capacitors 8 situated in the ring segments 9.

Figure 2:
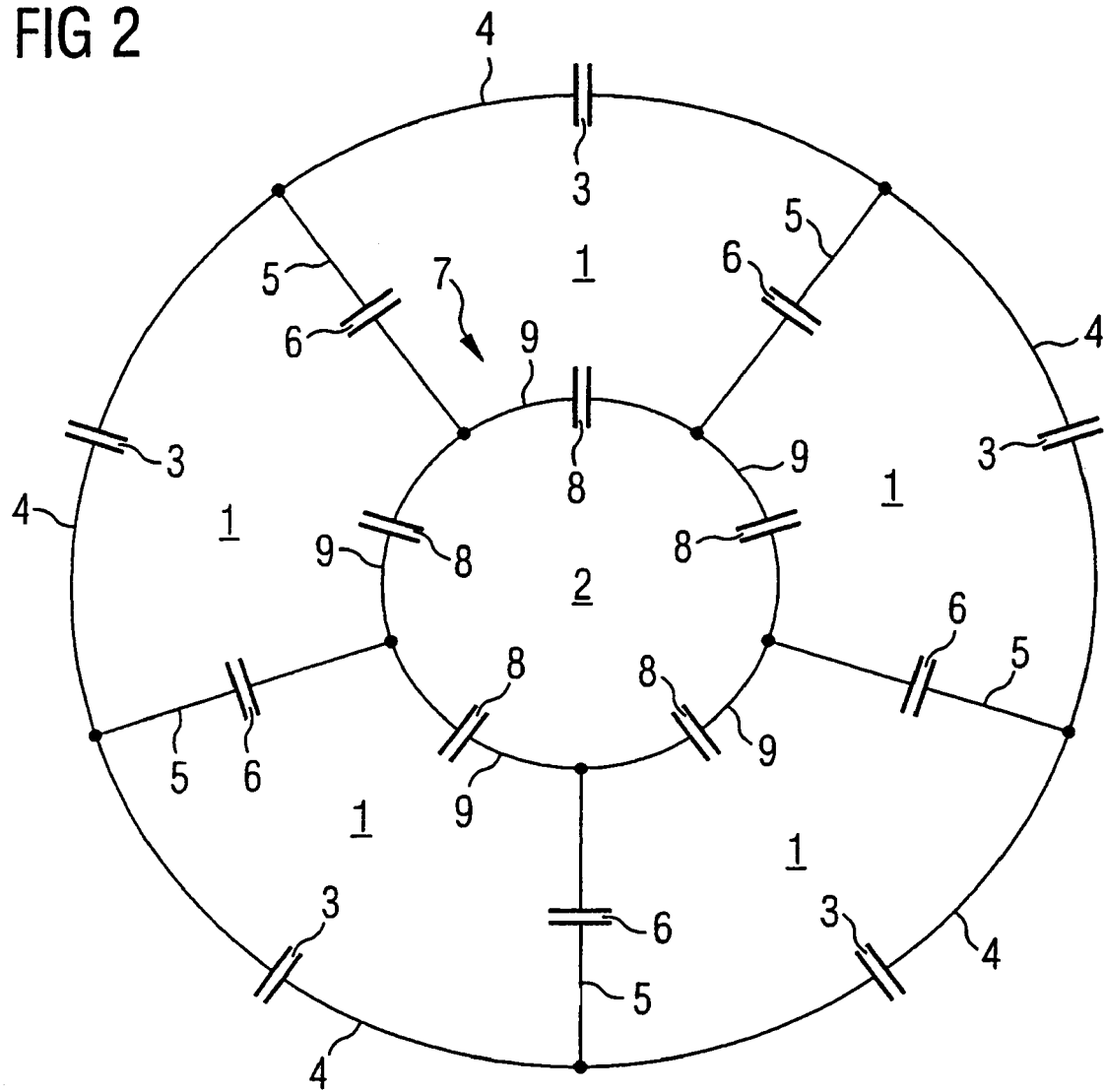
Figure 6:
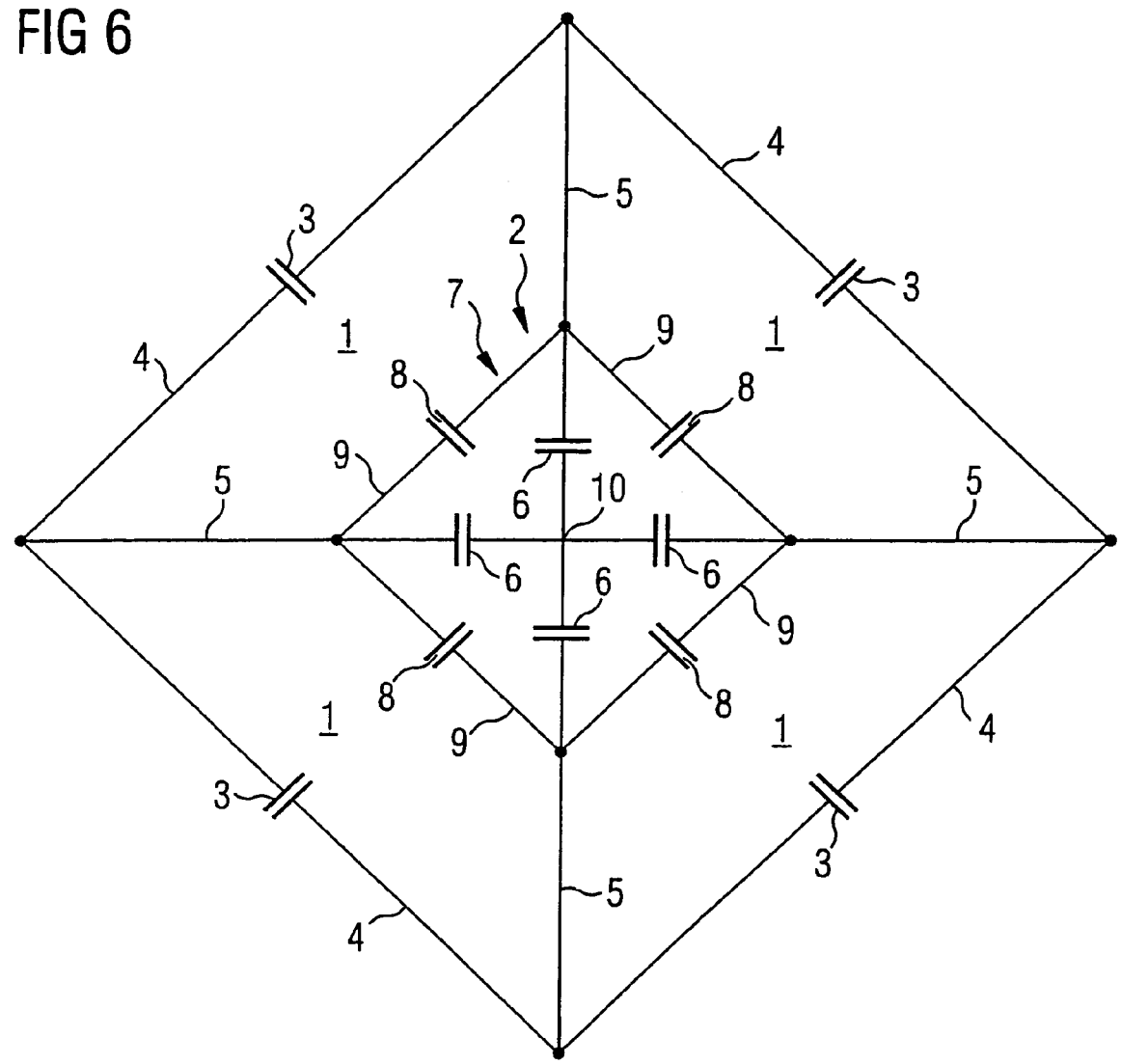
Figure 7:
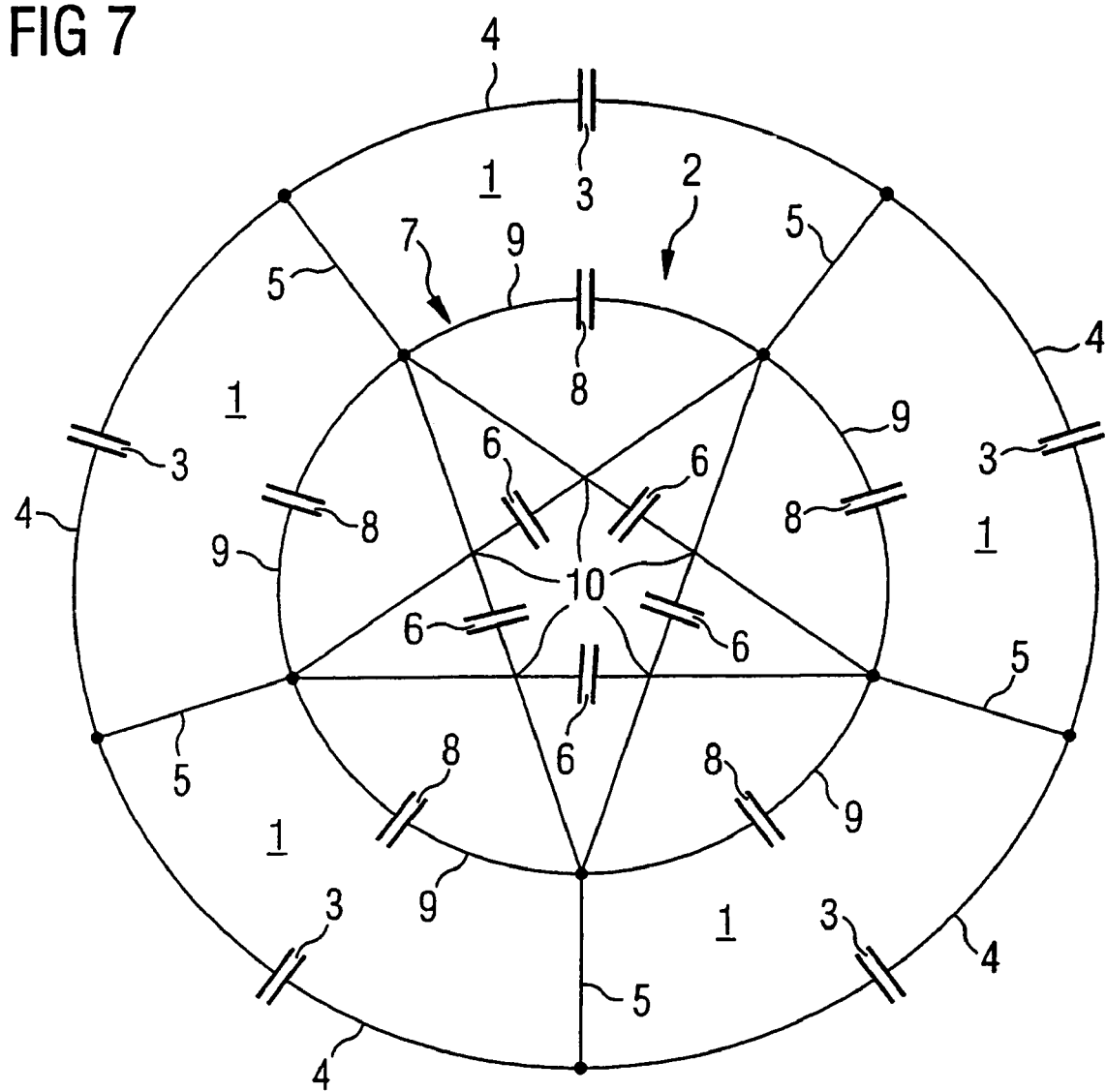

FIGS. 6 and 7 represent modifications of the capacitor network 7 of FIGS. 1 and 2. The difference between the capacitor networks 7 of FIGS. 6 and 7 and the capacitor networks 7 of FIGS. 1 and 2 is that in FIGS. 6 and 7 decoupling capacitors 6 are components of capacitor network 7. Otherwise, the embodiments of FIGS. 1 and 2 can be retained.

It should also be noted that in FIG. 6 the point of crossing 10 between decoupling capacitors 6 can alternatively be either a pure crossing point (i.e., without an electrical cross-connection of the crossing lines) or a node point (i.e., with electrical connection of the crossing lines). The same is true for crossing points 10 of FIG. 7.

Figure 8:
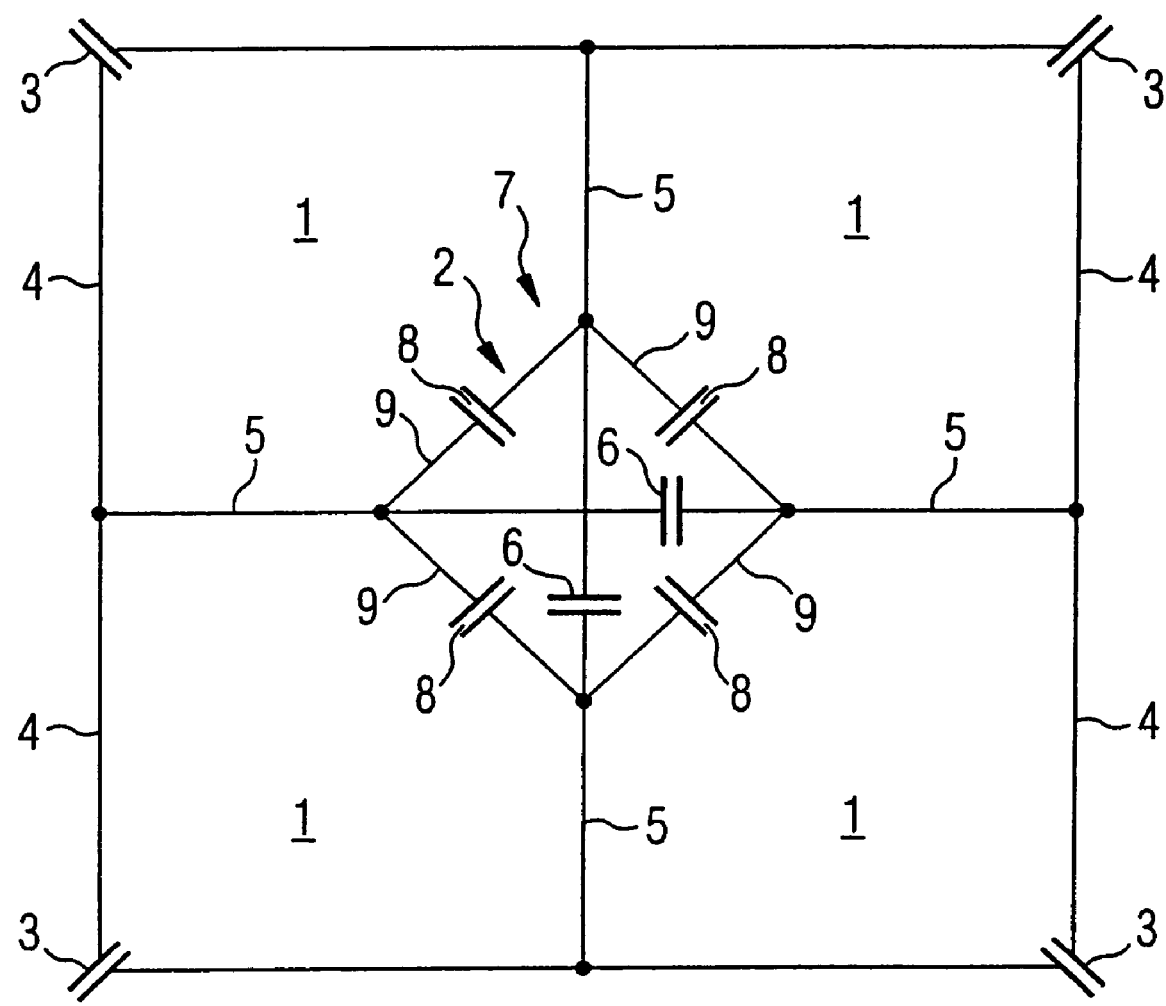

FIG. 8 represents a modification of FIG. 6. The difference between FIG. 8 and FIG. 6 is that according to FIG. 8 each decoupling capacitor 6 decouples two pairs of respectively immediately adjacent coil elements 1 of the coil arrangement from one another.

Figure 9:
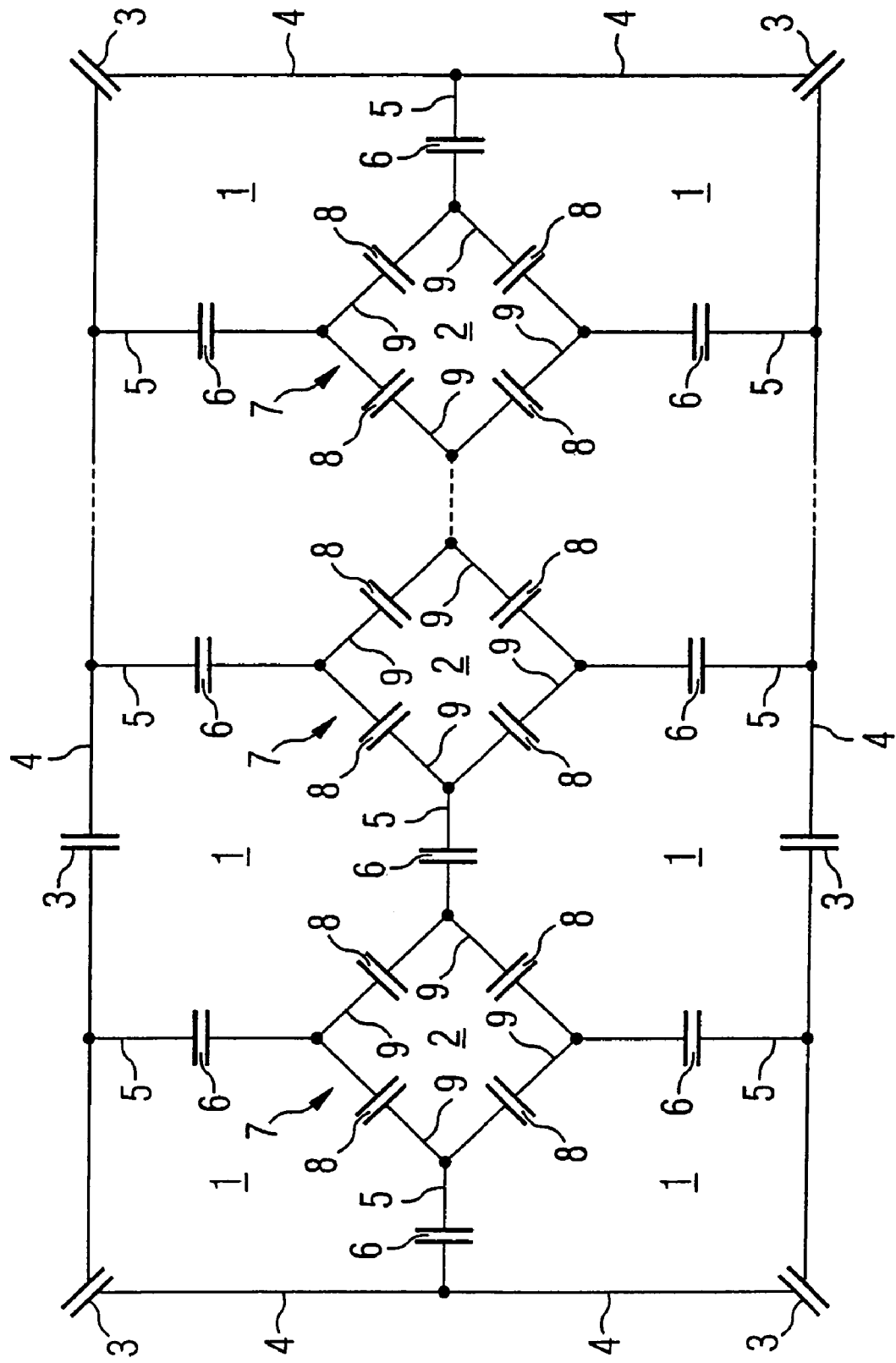

FIG. 9 shows an expansion of the basic form of the present invention according to FIG. 1. According to FIG. 9, a number of capacitor networks 7 are present. Four coil elements 1 adjoin each capacitor network 7. Together with the respective central capacitor network 7, these four coil elements 1 each form a coil arrangement according to the present invention.

Figure 5:
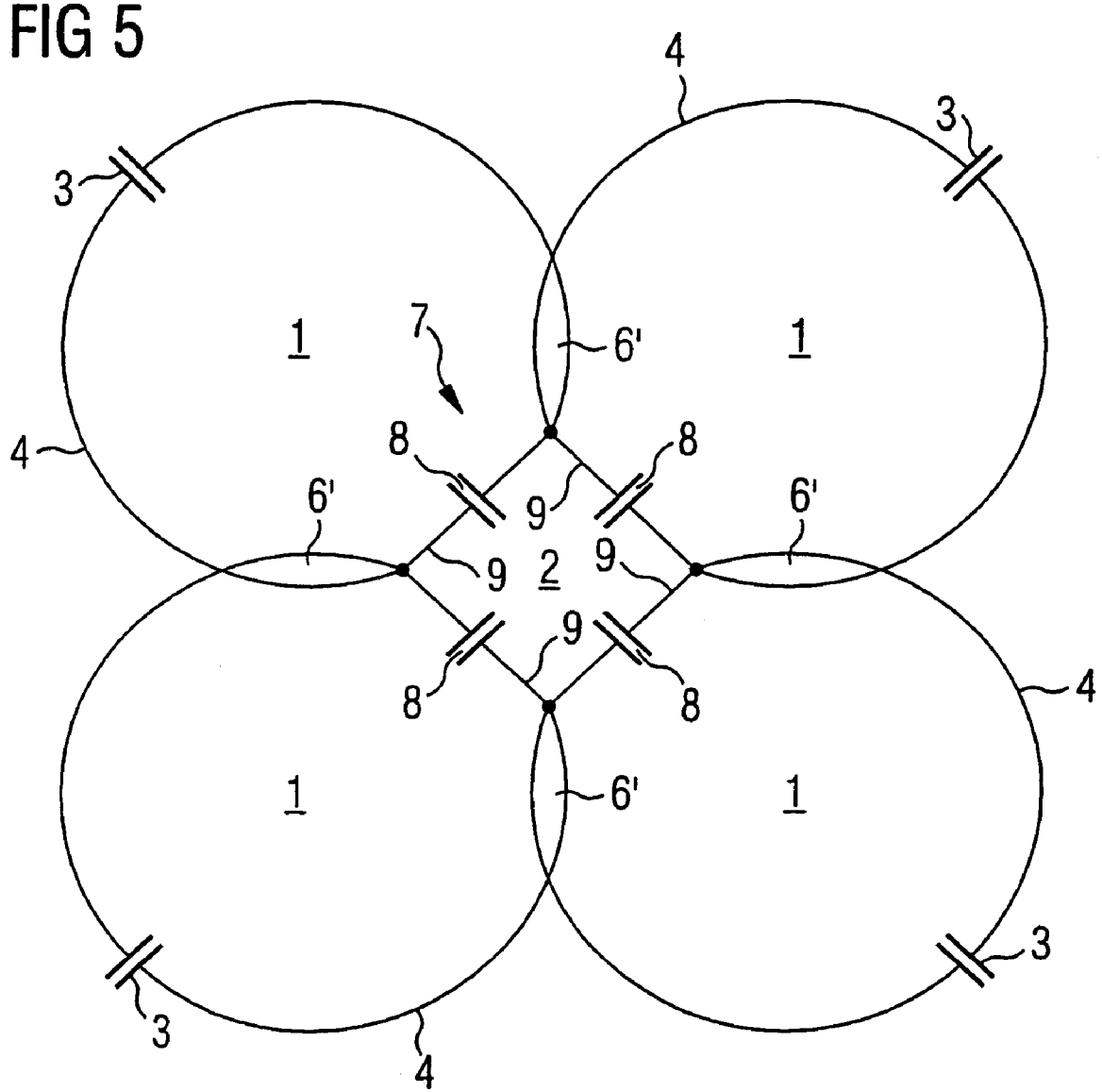

Of course, in the embodiment according to FIG. 9 the modifications according to FIGS. 5, 6, and 8 would also be possible.

By means of the coil arrangement according to the present invention, coil elements 1 are capable of being operated largely without coupling and independently of one another, in a simple manner.

Although modifications and changes may be suggested by those skilled in the art, it is the intention of the inventors to embody within the patent warranted hereon all changes and modifications as reasonably and properly come within the scope of their contribution to the art.

We claim as our invention:

1. A coil arrangement configured for a magnetic resonance apparatus comprising:

a plurality of coil elements each being independently operable and being disposed around a common central area, immediately adjacent coil elements of said plurality of coil elements having a common conductor area, forming respective parts of each of said adjacent coil elements, that proceeds exclusively radially relatively to said central area;

each of said coil elements being decoupled capacitively or inductively from coil elements immediately adjacent thereto;

a capacitor network, comprised of capacitors, disposed in said central area and connecting all of said coil elements; and said capacitors in said capacitor network being connected and dimensioned to at least reduce coupling of each of said coil elements to at least one further coil element of said coil elements that is not immediately adjacent thereto.

2. A coil arrangement as claimed in claim 1 wherein said capacitors in said capacitor network are connected and dimensioned so that each of said coil elements is additionally decoupled from at least one additional further coil element that is not immediately adjacent thereto.

3. A coil arrangement as claimed in claim 2 wherein said capacitors of said capacitor network are connected and dimensioned so that each of said coil elements is completely decoupled from all others of said coil elements that are not immediately adjacent thereto.

4. A coil arrangement as claimed in claim 1 wherein said capacitor network comprises a ring having ring segments, and wherein the respective common conductor areas of the respective adjacent coil elements are connected to each other by respective ring segments, with each ring segment containing a capacitor of said capacitor network.

5. A coil arrangement as claimed in claim 4 wherein said capacitor network comprises no additional capacitors other than the capacitors respectively connected in said ring segments.

6. A coil arrangement as claimed in claim 1 comprising decoupling capacitors respectively connected in said common conductor areas.

7. A coil arrangement as claimed in claim 1 wherein said plurality of coil elements is even.

8. A coil arrangement as claimed in claim 7 wherein said plurality of coil elements is four.

* * * * *